(12) United States Patent
Jackoski et al.

(10) Patent No.: US 10,886,774 B2
(45) Date of Patent: Jan. 5, 2021

(54) METHOD AND APPARATUS TO SWITCH POWER SUPPLY FOR LOW CURRENT STANDBY OPERATION

(71) Applicant: NXP USA, Inc., Austin, TX (US)

(72) Inventors: Keith Jackoski, Chandler, AZ (US); Arif Alam, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 318 days.

(21) Appl. No.: 16/175,192

(22) Filed: Oct. 30, 2018

(65) Prior Publication Data

US 2020/0136426 A1    Apr. 30, 2020

(51) Int. Cl.
*H02J 9/00* (2006.01)
*H02J 9/06* (2006.01)
*H03K 17/687* (2006.01)

(52) U.S. Cl.
CPC .............. *H02J 9/005* (2013.01); *H02J 9/061* (2013.01); *H03K 17/6872* (2013.01)

(58) Field of Classification Search
CPC ...... H02J 9/005; H02J 9/061; H03K 17/6872; Y02B 70/30; Y02B 70/10; Y04S 20/20; H02M 3/33561; H02M 2001/008; H02M 1/36; H02M 2001/0032; H02M 1/00; H02M 1/08
See application file for complete search history.

(56) References Cited

U.S. PATENT DOCUMENTS

| | | | |
|---|---|---|---|
| 5,394,028 A | 2/1995 | Feddeler et al. | |
| 5,991,168 A | 11/1999 | Farrington et al. | |
| 6,566,935 B1 | 5/2003 | Renous | |
| 6,774,704 B2* | 8/2004 | Kushnarenko | G11C 8/08 327/530 |
| 8,258,853 B2* | 9/2012 | Ku | H03K 19/0948 327/408 |
| 9,640,972 B2 | 5/2017 | Kreuter et al. | |
| 2007/0046273 A1 | 3/2007 | Riehl | |
| 2007/0109026 A1 | 5/2007 | Ho | |
| 2019/0302819 A1* | 10/2019 | Hu | G05F 3/24 |

FOREIGN PATENT DOCUMENTS

CN        104092438 A     10/2014

* cited by examiner

*Primary Examiner* — Jared Fureman
*Assistant Examiner* — Emmanuel Dominique
(74) *Attorney, Agent, or Firm* — Charlene R. Jacobsen

(57) ABSTRACT

A method for switching a power supply for low current standby operation includes deactivating a first supply connected to a first supply node, in response to activating an enable signal. A second supply is changed to a low power mode in response to activating the enable signal, wherein the second supply is connected to a second supply node. The first supply node is connected to the second supply node in response to a first voltage of the first supply node being less than or equal to a positive offset above a second voltage of the second supply node. The first supply node is disconnected from the second supply node in response to deactivating the enable signal, wherein the first supply node is disconnected at a rate preventing the first supply node from discharging below a first supply minimum voltage.

20 Claims, 5 Drawing Sheets

METHOD AND APPARATUS TO SWITCH POWER SUPPLY FOR LOW CURRENT STANDBY OPERATION

FIELD

This disclosure relates generally to power supply management, and more specifically to transitioning a power supply between high current and low current standby modes.

BACKGROUND

Electronic systems frequently employ multiple voltage domains to manage a combination of execution speed, analog linearity and extended standby operations. Transitioning between active and standby modes for systems having multiple voltage domains may require shutting down a voltage domain or sharing one voltage domain with another voltage domain. Simply deactivating a power supply of one voltage domain and shorting it's domain, or physical network of devices, with another power supply may result in undesirable voltage transients and charge sharing effects. Other approaches that rely on complicated multiplexors, controllers and the like require additional area, complexity and attention to their own power requirements.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for a smooth transition of a power supply from a high power mode to a low power mode through power supply deactivation and supply node reconnection. A power supply on one supply node is deactivated. Subsequently, the supply node is connected to another supply node having a power supply that will transition to a low power mode. Due to voltage and capacitive imbalances between the supply nodes, a new method is required to avoid undesirable capacitive charge sharing effects and consequential excessive voltage transitions. In one example, a supply is "hot-swapped" or removed from a system, while the remaining system components continue to operate.

In an example embodiment, a mode control and switch control are used to control the activation and deactivation of an isolation switch. The mode control does not allow the isolation switch to connect the supply nodes together until the deactivated power supply has decayed to within an acceptable range. The system thus enables shorting of the supply nodes without excessive voltage excursions and without the complexity of additional multiplexors or controllers. Furthermore, the disclosed method and apparatus ensures a fast disconnection of the supply nodes upon reactivation of the previously deactivated power supply, thereby preventing excessive supply droop on the node serviced by the reactivated supply.

Figure 1:
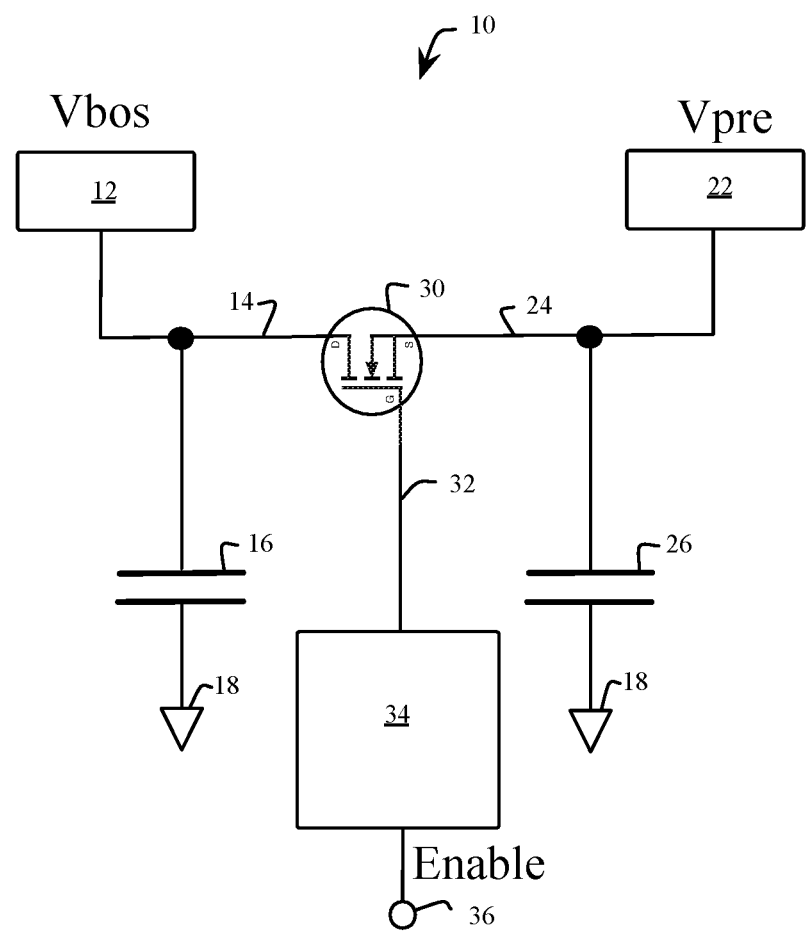
FIG. 1 is a schematic view of an embodiment of a system for switching a power supply between a high current and a low current standby mode.

FIG. 1 shows an embodiment 10 of a system for switching a power supply to a low current (or power) mode. The embodiment 10 includes a first supply 12 (Vbos) connected to a first supply node 14. A first capacitive load 16 is connected between the first supply node 14 and a ground 18. A second supply 22 (Vpre) is connected to a second supply node 24. A second capacitive load 26 is connected between the second supply node 24 and the ground 18. A switch 30 is configured to connect the first supply node 14 to the second supply node 24 in response to a switch gate 32. The switch gate 32 is controlled by a control circuit 34, which is enabled by an Enable signal 36.

Figure 2:
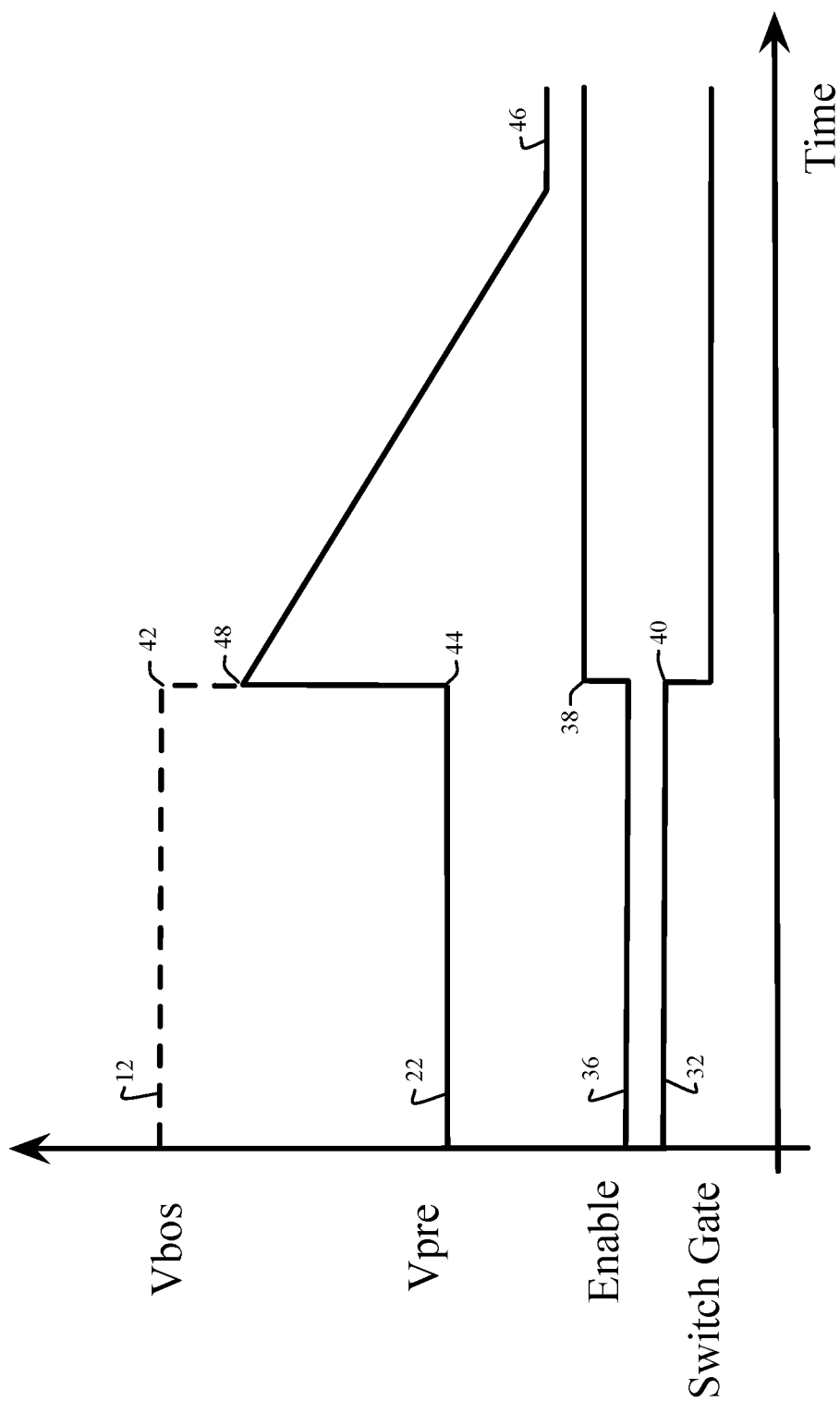
FIG. 2 is a graphical view of timing waveforms according to the embodiment of FIG. 1.

With reference to FIG. 1 and FIG. 2, in one example embodiment, the first supply 12 supplies 5V, the second supply 22 supplies 3V, the first capacitive load is 40 uF and the second capacitive load is 10 uF. Asserting the Enable signal 36 at time 38 causes the control circuit 34 to activate the switch gate 32 at time 40. Asserting the Enable signal 36 also disables the first supply 12 at time 42 and changes the second supply 22 at time 44 to enter a low power mode. The low power mode of the second supply 22 causes the voltage supplied by the second supply 22 to eventually drop to a lower voltage 46. In one example embodiment, the second supply 22 is a buck converter and switching from a high power mode to the low power mode includes changing the buck converter operation from a Pulse Width Modulation (PWM) mode to a Pulse Frequency Modulation (PFM) mode.

The switch 30 is activated with an active low switch gate 32 resulting in a short between the first supply node 14 and the second supply node 24. By shorting the first supply node 14 to the second supply node 24, while having a substantial voltage and capacitive imbalance between the two, results in an undesirable voltage transient step from the previous value of the second supply (Vpre) 22 to the voltage level 48. The voltage level 48 is high enough to potentially cause damage to circuitry (e.g., a microprocessor) supplied by the lower voltage second supply 22. In various embodiments, the Vbos supply 12 is a "best of supplies" source that uses a priority ordering to determine which one of a plurality of supplies to use based on power supply efficiency. In one example, the Vbos supply 12 is prioritized to use a buck converter, then a boost converter, and then a battery supply. In one embodiment, the Vpre supply 22 is a pre-regulator supply.

Figure 3:
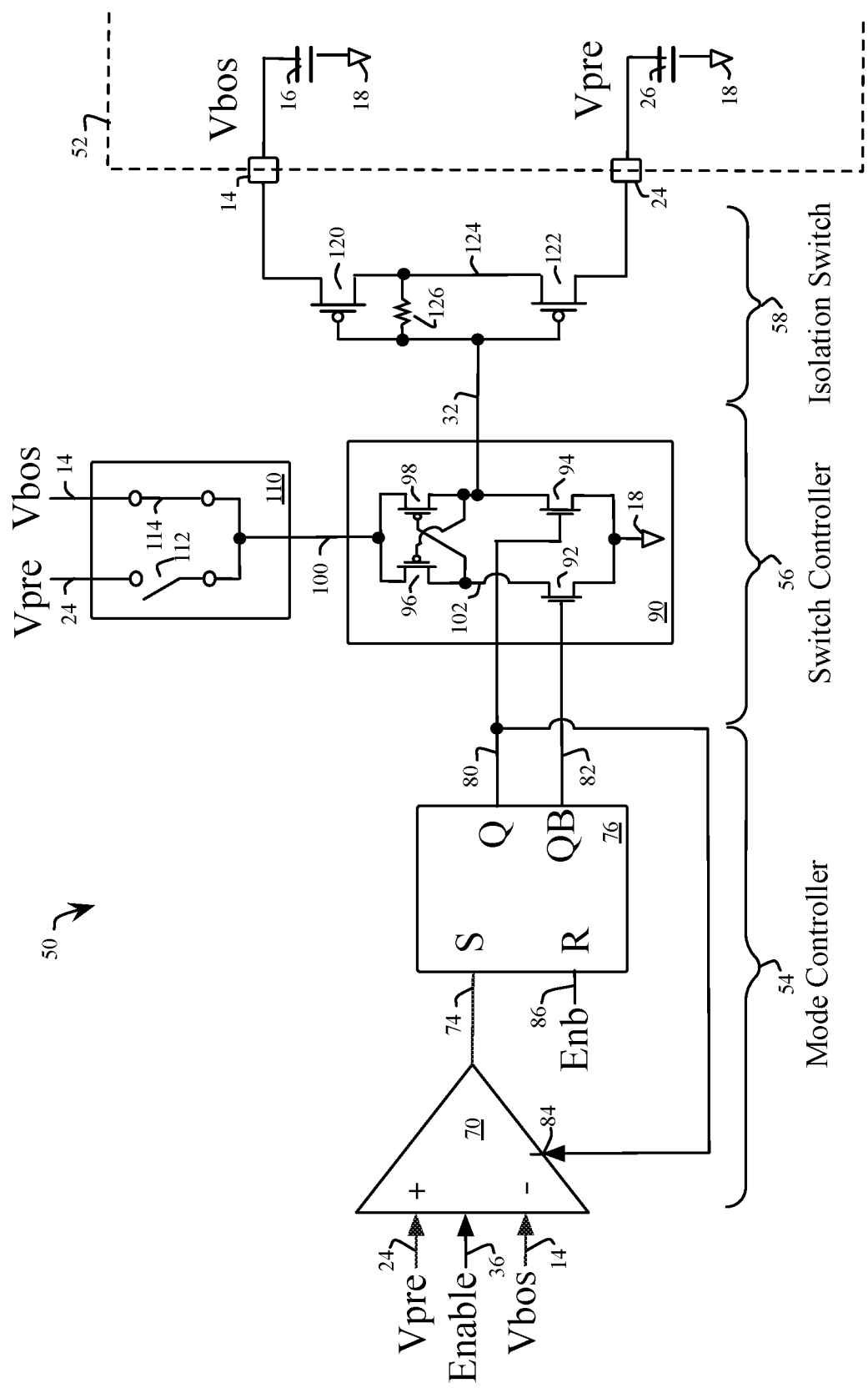
FIG. 3 is a schematic view of an apparatus for switching a power supply between a high current and a low current standby mode in accordance with an example embodiment of the present disclosure.

Referring now to FIG. 3 with continued reference to FIG. 1, an embodiment 50 of an apparatus for switching a power supply to a low current standby mode is described to overcome the aforementioned transient voltage issue resulting from the charge sharing between the first supply node 14 and the second supply node 24, amongst other advantages. Specifically, the isolation switch 58 of FIG. 3 replaces the switch 30 of FIG. 1, and the mode controller 54 and the switch controller 56 of FIG. 3 replaces the control circuit 34 of FIG. 1. The embodiment 50 connects to the first supply node 14 and the second supply node 24 at a component boundary 52. The first capacitive load 16 and the second capacitive load 26 are each external to the component boundary 52 (e.g., "off-chip") and are referenced to a ground 18. In various embodiments, the component boundary 52 is the external interface to a monolithic Integrated Circuit (IC), a multi-chip module or an edge of a printed circuit board including one or more of discrete or IC components.

The embodiment 50 includes a mode controller 54, a switch controller 56 and an isolation switch 58. The mode controller 54 includes a comparator 70 connected with a connection 74 to a SET input of a bistable device 76 (e.g., a Set-Reset Flip Flop, or a latch). When the Enable signal 36 transitions to a TRUE state (e.g., a high level or logical "1"), the first supply 12 is deenergized or disconnected from the first supply node 14, and the second supply 22 transitions to a low power mode. In addition, when the comparator 70 receives the Enable signal 36 with the TRUE state, the comparator 70 will set the bistable device 76 when the first supply node 14 decays to a level equal to a positive offset (not shown) above the second supply node 24. In an example embodiment, the comparator 70 and the bistable device 76 are powered by a constant supply voltage (not shown). In various example embodiments, the comparator 70 and the bistable device 76 operate from a 5V supply, regulated from a battery operating between 12V and 60V.

In one embodiment, the comparator 70 includes a positive offset of 70 mV. In another embodiment, the comparator 70 is a comparator with hysteresis equal to the positive offset. In an example embodiment, the positive offset is designed to be large enough to ensure that the first supply node 14 does not discharge to a level that will trigger a Power On Reset (POR) event on a device connected to the second supply node 24. The positive offset is also small enough to ensure that the device on the second supply node 24 is not subject to an excessive voltage that would cause a voltage breakdown or other reliability failure.

After the bistable device 76 is set by the comparator 70, a latch output 80 transitions to a high state and an inverted latch output 82 transitions to a low state. The latch output 80 then disables the comparator 70 at a disable input 84 to reduce or eliminate bias current conduction in the comparator 70, thereby reducing power consumption during the low power state of the second supply 22. When the Enable signal 36 transitions to a FALSE state, the inverted Enable signal 86 ("Enb") will transition to a high state and quickly reset the bistable device 76.

The switch controller 56 comprises an inverting level shifter 90 for shifting an amplitude of the outputs of the bistable device 76 to interface with the variable voltage requirements of the isolation switch 58. The inverting level shifter 90 includes a pair of N-channel Field Effect Transistors (FETs) 92 and 94, receiving a differential input formed by the inverted latch output 82 and the latch output 80, respectively. The pair of N-channel FETs (NFETS) 92 AND 94, share respective drain connections 102 and 32 with a cross-coupled pair of P-channel FETs (PFETs) 96 and 98. The drain connection provides a shifted latch output (or switched gate) to the isolation switch 58. Accordingly, the shifted latch output 32 is an amplified and inverted version of the latch output 80.

The inverting level shifter 90 is connected between a connection 100 and the ground 18. A highest voltage circuit 110 ensures that a highest voltage of either the first supply 12 or the second supply 22 is used to ensure proper deactivation of the isolation switch in the presence of varying voltages from the first supply 12 and the second supply 22. The highest voltage circuit 110 connects either the first supply 12 or the second supply 22 to the connection 100 with respective switches 112 and 114 based on which of the first supply 12 or the second supply 22 has the highest voltage. In one embodiment, a separate voltage comparator, (not shown), determines the highest voltage.

The isolation switch 58 comprises serially connected PFETs 120 and 122 having a common gate connected to the shifted latch output 32 and a common drain connection 124. The PFETs 120 and 122 are connected between the first supply node 12 and the second supply node 24. The PFETs 120 and 122 are arranged as a back-to-back switch to prevent unwanted reverse supply current. For example, back-to-back switch isolation is necessary to prevent the first supply 12 from pulling up the second supply node 24, if the first supply 12 is activated before the second supply 22. In particular, if the first supply 12 is ramped to 5V and the second supply will ramp to 3V, a lack of back-to-back switch isolation may cause overvoltage stress on a microprocessor connected to the second supply node 24. In various embodiments, a high value resistor 126 is connected between the shifted latch output 32 and the common drain 24 to ensure that the PFETs 120 and 122 are fully deactivated when the shifted latch output 32 is pulled to the highest voltage by the highest voltage circuit 110.

Figure 4:
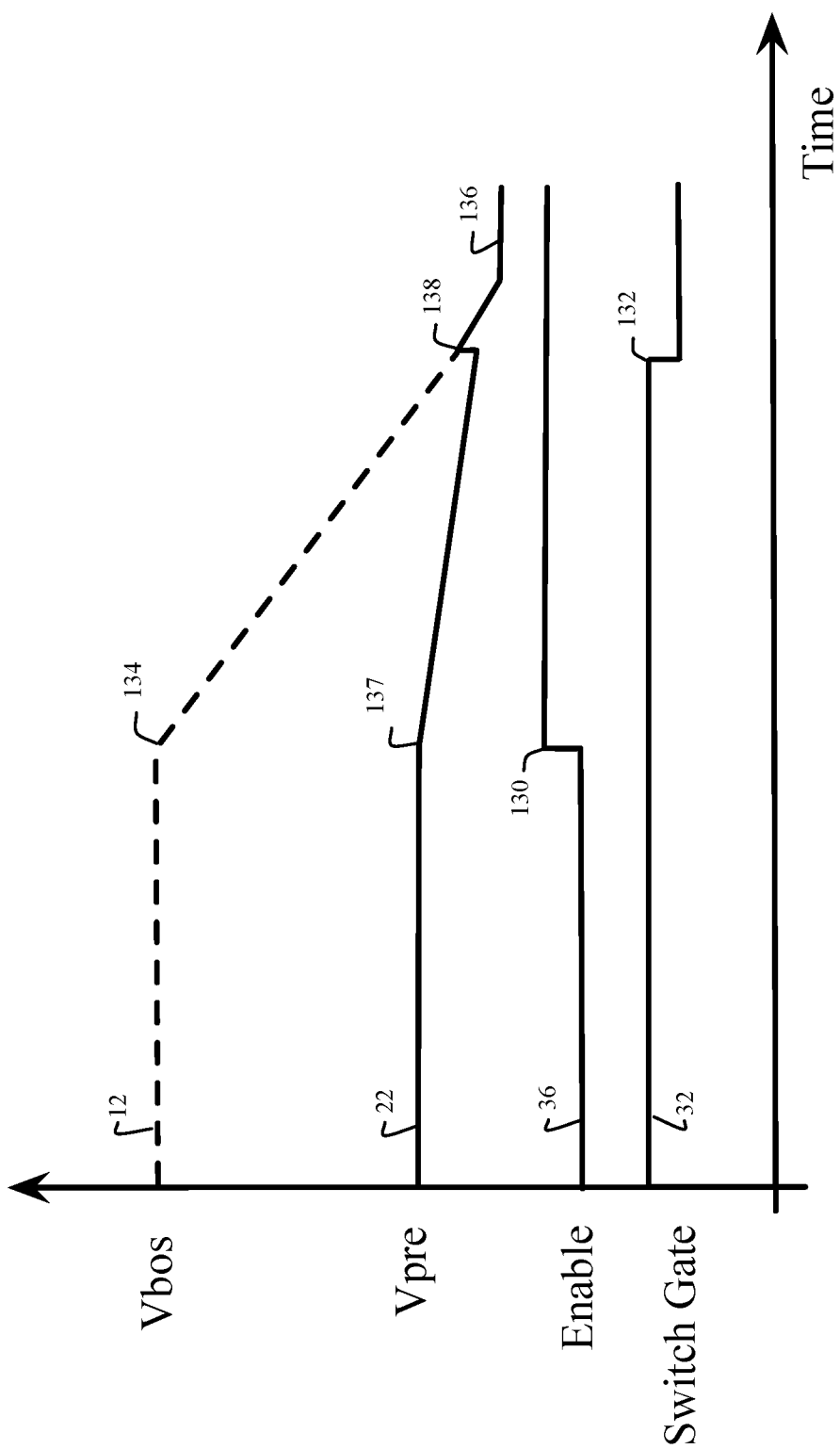
FIG. 4 is a graphical view of timing waveforms according to the embodiment of FIG. 3.

Referring now to FIG. 4, with continued reference to FIG. 3 and in contrast to FIG. 2, the operation of the embodiment 50 of FIG. 3 is further explained. In response to the Enable signal 36 being activated at time 130, the first supply 12 is deactivated, causing the first supply node 14 to begin to discharge at time 134. In addition, activating the Enable signal 36 causes the second supply 22 is switch to a low power mode, causing the second supply node 24 to discharge starting at time 137 until a settled value at voltage 136. Unlike the embodiment described in FIG. 2, the switch gate signal 32 is delayed to time 132 until the first supply node 14 discharges to within a positive offset of the second supply node 24 as determined by the comparator 70.

Accordingly, the comparator 70 is activated causing the first supply node 14 to short to the second supply node 24. Consequently, the resulting transient voltage 138 is considerably muted in comparison to the transient voltage 48 of FIG. 2. The positive offset voltage is chosen to prevent the voltage transient 138 from exceeding a maximum voltage of any device (e.g. a microprocessor) connected to the second supply node 24, while also ensuring that the resulting voltage on the second supply node 24 does not fall below a voltage that would activate a POR circuit.

Figure 5:
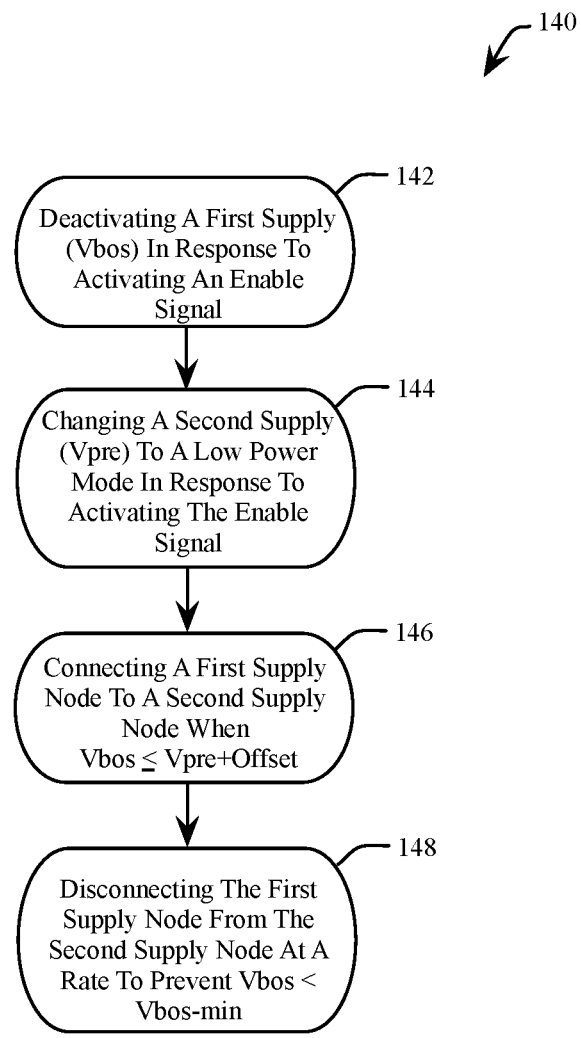
FIG. 5 is a flowchart representation of a method for switching a power supply for low current standby operation in accordance with an example embodiment of the present disclosure.

FIG. 5 shows a method 140 for switching a power supply for low current standby operation. At 142, a first supply 12 is deactivated in response to the Enable signal 36 being activated at time 130. At 144, a second supply 22 is changed to a low power mode in response to the Enable signal 36 being activated at time 130. At 146, a first supply node 14 is connected to a second supply node 24 when the first supply node 14 is less than or equal to a positive offset above the second supply node 24. At 148, the first supply node 14 is disconnected form the second supply node 24 at a rate to prevent the first supply node 14 from discharging below a first supply minimum voltage.

As will be appreciated, embodiments as disclosed include at least the following. In one embodiment, a method for switching a power supply for low current standby operation comprises deactivating a first supply connected to a first supply node, in response to activating an enable signal. A second supply is changed to a low power mode in response to activating the enable signal, wherein the second supply is connected to a second supply node. The first supply node is connected to the second supply node in response to a first voltage of the first supply node being less than or equal to a positive offset above a second voltage of the second supply node. The first supply node is disconnected from the second supply node in response to deactivating the enable signal, wherein the first supply node is disconnected at a rate preventing the first supply node from discharging below a first supply minimum voltage.

In another embodiment, an apparatus for switching a power supply for low current standby operation comprises a first supply connected to a first supply node. A second supply is connected to a second supply node. A mode controller is connected to an enable signal, the first supply node and the second supply node. The mode controller is configured to set a latch in response to the first supply being less than or equal to a positive offset above the second supply when the enable signal is set to a true state. A switch controller is connected to an inverted latch output of the latch. The switch controller is configured to generate a shifted latch output comprising an amplitude voltage comprising a highest voltage of one of the first voltage of the first supply and the second voltage of the second supply. An isolation switch is connected to the shifted latch output, the first supply node and the second supply node. The isolation switch is configured to connect the first supply node to the second supply node in response to a low voltage on the shifted latch output.

In another embodiment, an apparatus for switching a power supply for low current standby operation comprises a first supply connected to a first supply node. A second supply is connected to a second supply node. A comparator is connected to the first supply, and is configured to set a latch in response to a first voltage of the first supply being less than or equal to a positive offset above a second voltage of the second supply when an enable signal is set to a true state. An inverting level shifter configured to shift an amplitude of an inverted latch output of the latch by the greater of the first voltage and the second voltage to generate a shifted latch output. An isolation switch is configured to connect the first supply node to the second supply node in response to the shifted latch output being in a low state.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for switching a power supply for low current standby operation comprising:
    deactivating a first supply connected to a first supply node, in response to activating an enable signal;
    changing a second supply to a low power mode in response to activating the enable signal, wherein the second supply is connected to a second supply node;
    connecting the first supply node to the second supply node in response to a first voltage of the first supply node being less than or equal to a positive offset above a second voltage of the second supply node; and
    disconnecting the first supply node from the second supply node in response to deactivating the enable signal, wherein the first supply node is disconnected at a rate preventing the first supply node from discharging below a first supply minimum voltage.

2. The method of claim 1 further comprising choosing one of a plurality of supplies as the first supply based on a priority ordering, wherein the plurality of supplies comprise a buck converter, a boost converter and a battery.

3. The method of claim 1 wherein changing the second supply to the low power mode comprises switching a buck converter from a Pulse Width Modulation mode to a Pulse Frequency Modulation mode.

4. The method of claim 1 wherein connecting the first supply node to the second supply node comprises activating a plurality of Field Effect Transistors (FETs) connected in series therebetween, the FETs activated with a low state on a common gate of the FETs.

5. The method of claim 1 wherein disconnecting the first supply node from the second supply node comprises deactivating a pair of FETs arranged in series between the first supply node and the second supply node, the FETs deactivated with a high state on a common gate of the FETs, the common gate connected to a shifted latch output generated by shifting an amplitude of an inverted latch output of a latch with an inverting level shifter, and the amplitude shifted to a highest voltage comprising one of the first voltage and the second voltage.

6. The method of claim 1 further comprising comparing the first voltage to the second voltage with a mode controller comprising the positive offset.

7. The method of claim 1 wherein the positive offset is greater than a Power On Reset threshold of a device connected to the second supply node, and less than a breakdown voltage of the device.

8. The method of claim 1 wherein the first supply minimum voltage is greater than a minimum operating voltage of a device connected to the first supply node.

9. An apparatus for switching a power supply for low current standby operation comprising:
    a first supply connected to a first supply node;
    a second supply connected to a second supply node;
    a mode controller connected to an enable signal, the first supply node and the second supply node, the mode controller configured to set a latch in response to the first supply being less than or equal to a positive offset above the second supply when the enable signal is set to a true state;
    a switch controller connected to an inverted latch output of the latch, the switch controller configured to generate a shifted latch output comprising an amplitude voltage comprising a highest voltage of one of the first voltage of the first supply and the second voltage of the second supply; and
    an isolation switch connected to the shifted latch output, the first supply node and the second supply node, the isolation switch configured to connect the first supply node to the second supply node in response to a low voltage on the shifted latch output.

10. The apparatus of claim 9 wherein the isolation switch is configured to disconnect the first supply node from the second supply node, in response to a high voltage on the shifted latch output, at a rate preventing the first supply node from discharging below a first supply minimum voltage.

11. The apparatus of claim 9 wherein the first supply is chosen from a plurality of supplies based on a priority ordering, wherein the plurality of supplies comprises a buck converter, a boost converter and a battery.

12. The apparatus of claim 9 wherein the second supply is configured to enter a low power mode in response to the enable signal set to the true state.

13. The apparatus of claim 9 wherein the mode control comprises a comparator connected to the first supply node and the second supply node, the comparator configured to compare the first supply to the positive offset above the second supply, to be enabled by the enable signal, and to be disabled by the latch output transitioning to a true state.

14. The apparatus of claim 9 wherein the switch controller is connected by a respective switch to one of the first supply and the second supply having the highest voltage.

15. The apparatus of claim 9 wherein the isolation switch comprises two transistors connected in series between the first supply node and the second supply node, the two transistors having a common gate connected to the shifted latch output.

16. The apparatus of claim 15 wherein each of the two transistors is a P-type Field Effect Transistor.

17. The apparatus of claim 15 wherein the isolation switch further comprises a resistor between the common gate and the inverted shifted latch output, the resistor configured to keep each of the two transistors in an off state when the shifted latch output is in the high state.

18. An apparatus for switching a power supply for low current standby operation comprising:
  a first supply connected to a first supply node;
  a second supply connected to a second supply node;
  a comparator connected to the first supply, configured to set a latch in response to a first voltage of the first supply being less than or equal to a positive offset above a second voltage of the second supply when an enable signal is set to a true state;
  an inverting level shifter configured to shift an amplitude of an inverted latch output of the latch by the greater of the first voltage and the second voltage to generate a shifted latch output; and
  an isolation switch configured to connect the first supply node to the second supply node in response to the shifted latch output being in a low state.

19. The apparatus of claim 18 wherein the first supply is chosen from a plurality of supplies based on a priority ordering, wherein the plurality of supplies comprises a buck converter, a boost converter and a battery.

20. The apparatus of claim 18 wherein the second supply is configured to enter a low power mode in response to the enable signal set to the true state.

* * * * *